United States Patent [19]
Saitoh

[11] Patent Number: 5,511,011
[45] Date of Patent: Apr. 23, 1996

[54] METHOD AND APPARATUS FOR LOGIC SIMULATION OF LOGIC SYSTEM INCLUDING MULTI-PORT MEMORY

[75] Inventor: Minoru Saitoh, Kawasaki, Japan

[73] Assignee: Fujitsu Limited, Kawasaki, Japan

[21] Appl. No.: 54,258

[22] Filed: Apr. 30, 1993

[30] Foreign Application Priority Data

May 8, 1992 [JP] Japan .................... 4-116230

[51] Int. Cl.$^6$ .................................................. G06F 11/00
[52] U.S. Cl. ............................................ 364/578; 395/500
[58] Field of Search .................... 364/578, 488, 364/489, 490; 371/23, 21.1; 395/500

[56] References Cited

U.S. PATENT DOCUMENTS

| | | | |
|---|---|---|---|
| 4,587,625 | 5/1986 | Marino, Jr. et al. | 364/578 |
| 4,862,347 | 8/1989 | Rudy | 364/200 |
| 4,942,615 | 7/1990 | Hirose | 364/578 |
| 5,036,473 | 7/1991 | Butts et al. | 364/490 X |

OTHER PUBLICATIONS

"The Yorktown Simulation Engine", IEEE, Monty M. Denneau, 1982 pp. 55–59.

*Primary Examiner*—Ellis B. Ramirez
*Assistant Examiner*—M. Kemper
*Attorney, Agent, or Firm*—Staas & Halsey

[57] ABSTRACT

A simulation apparatus and method for a logic circuit including a multi-port RAM effects simulation by provisionally representing input and output ports by use of a plurality of memory primitives and effecting the operation equivalent to the operation of the multi-port RAM. The address, data input and write enable terminals of input side memory primitives are supplied with write addresses, data inputs and write enable signals, respectively, and the chip select terminals thereof are supplied with "0" from a logic primitive. The write enable signals are also supplied to an AND logic primitive. The address terminals of output side memory primitives are supplied with respective read addresses, the data input terminals thereof are supplied with an output of the AND logic primitive, the chip select terminals thereof are supplied with "0" from a logic primitive, and the write enable terminals thereof are supplied with "1" from a logic primitive. Data outputs are derived from the respective output side memory primitives.

8 Claims, 10 Drawing Sheets

|  | -WE | DO1 | DO2 |
|---|---|---|---|
| ADDR1 ≠ ADDR2 | H | READ ADDR1 | READ ADDR2 |
|  | L | DI(WRITE) | READ ADDR2 |
| ADDR1 = ADDR2 | H | X | X |
|  | L | X | X |

METHOD AND APPARATUS FOR LOGIC SIMULATION OF LOGIC SYSTEM INCLUDING MULTI-PORT MEMORY

BACKGROUND OF THE INVENTION

1. Field of the Invention

This invention relates to a method and apparatus for effecting the logic simulation of a logic circuit system including a multi-port memory such as a multi-port RAM (random access memory).

2. Description of the Related Art

Broadly speaking, a multi-port RAM indicates a RAM having a plurality of independently addressable ports, each of the ports being write or read port, i.e., input or output port, respectively. Such a multi-port RAM has a function of permitting different addresses to be accessed via a plurality of ports, and it is possible to simultaneously access different addresses via a plurality of read ports so as to read out the stored contents in the respective addresses via the corresponding ports, for example.

Recently, this type of multi-port RAM can be manufactured at a low cost and is frequently used in an LSI (large scale integrated) circuit as a built-in RAM of the LSI circuit.

FIG. 1 shows an example of the conceptional construction of a multi-port RAM.

The multi-port RAM shown in FIG. 1 has a plurality of write ports WP1 to WPn and a plurality of read ports RP1 to RPm. The write ports WP1 to WPn are supplied with three types of inputs: write addresses WADDR1 to WADDRn, write data items WDATA1 to WDATAn and write enable signals WE1 to WEn. The read ports RP1 to RPm are supplied with readout addresses RADDR1 to RADDRm and output data readout outputs DOUT1 to DOUTm.

Generally, in a case where a logic circuit is constructed in the form of an LSI circuit, whether the logic circuit is correctly operated or not is evaluated and checked by use of a simulator. Therefore, when the LSI circuit is a logic circuit including a memory, it is necessary to simulate the write and read operations with respect to the memory by use of the simulator.

As the technique for effecting the simulation for the logic circuit including the memory, for example, the technique disclosed in U.S. Pat. No. 4,942,615 is known. In U.S. Pat. No. 4,942,615, the technique of evaluating a logic circuit having logic gates and memories by simulation is disclosed.

However, the conventional simulation technique including the technique disclosed in the above U.S. Patent is developed to deal with a logic circuit including only a RAM (different from a multi-port RAM) having one pair of write and read ports as a memory primitive. Therefore, with the conventional simulation technique, it is difficult to effectively effect the simulation of a logic circuit including a multi-port RAM which effects complicated operations.

Therefore, in general, when the simulation for the logic circuit including the multi-port RAM is effected, the RAM portion is separated from the main circuit portion, the logic circuit is divided into the input side logic circuit portion and the output side logic circuit portion, and they are separately simulated and evaluated.

SUMMARY OF THE INVENTION

An object of this invention is to provide a simulation method and apparatus for permitting a logic system including a multi-port memory such as a multi-port RAM to be effectively simulated.

At the time of evaluation of a logic system including the multi-port memory, the simulation method and apparatus of this invention provisionally deal with the input and output ports of the multi-port memory as discrete memory primitives and treat the multi-port memory as if it is formed of a plurality of memory primitives so that the operation equivalent to the actual operation of the multi-port memory can be attained.

In the simulation in this invention, the multi-port memory can be reproduced by setting the base addresses of the memory primitives constructing the same multi-port memory to the same value.

At this time, the simulator can be informed of occurrence of an event by transmitting a variation in a write enable signal of an input side memory primitive, that is, a memory primitive of the input port to an output side memory primitive, that is, a memory primitive of the output port as an input variation of the memory primitive and the output side memory primitive can read out and output the newest storage content. Thus, the logic system can be evaluated by use of the simulator according to the algorithm using the event-driven simulation.

On the other hand, by defining the input side memory primitive to have an evaluation level of higher priority (smaller level value) than the output side memory primitive, output data from the output side memory primitive can be evaluated after the write operation with respect to the input side memory primitive is effected. Therefore, the logic system can be evaluated according to the algorithm using the rank order simulation without causing any inconsistency in the order of evaluation.

According to the system of this invention, the effective simulation for a logic circuit including a multi-port memory can be attained by adequately constructing the multi-port memory into a simulation model form by use of memory primitives.

DETAILED DESCRIPTION OF THE PREFERRED EMBODIMENTS

[Embodiment 1]

Figure 2:
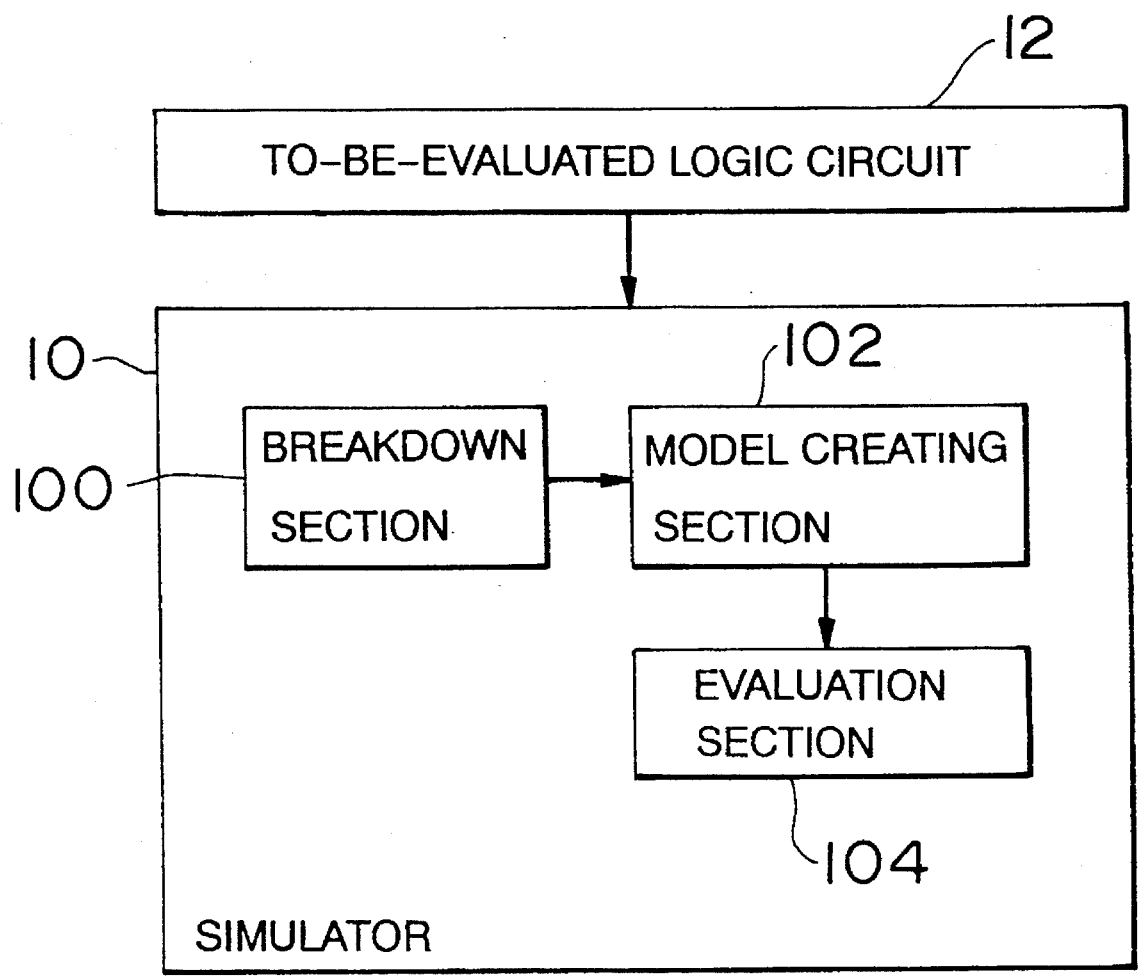
FIG. 2 is a block diagram showing the principle construction of a simulation system according to a first embodiment of this invention.

The concept of a simulation system according to this invention is shown in FIG. 2.

The simulation system of this invention is a system for evaluating a logic circuit including a multi-port RAM by simulation, for example.

In FIG. 2, a simulator 10 is a hardware simulator, software simulator or a combination thereof and evaluates a logic circuit 12 including a multi-port RAM by simulation.

The simulator 10 includes a breakdown section 100, model creating section 102 and evaluation section 104. The breakdown section 100 breaks down a to-be-evaluated logic circuit 12 into a structure constructed by a combination of memory elements and logic elements. The model creating section 102 converts the logic circuit 12 into a model form constructed by primitives including memory primitives and logic primitives based on the broken-down memory elements and logic elements. The evaluation section 104 executes the simulation according to an algorithm based on the event-driven simulation or rank order simulation by use of the memory primitives and logic primitives so as to evaluate the logic circuit 12 containing a multi-port RAM.

Figure 1:
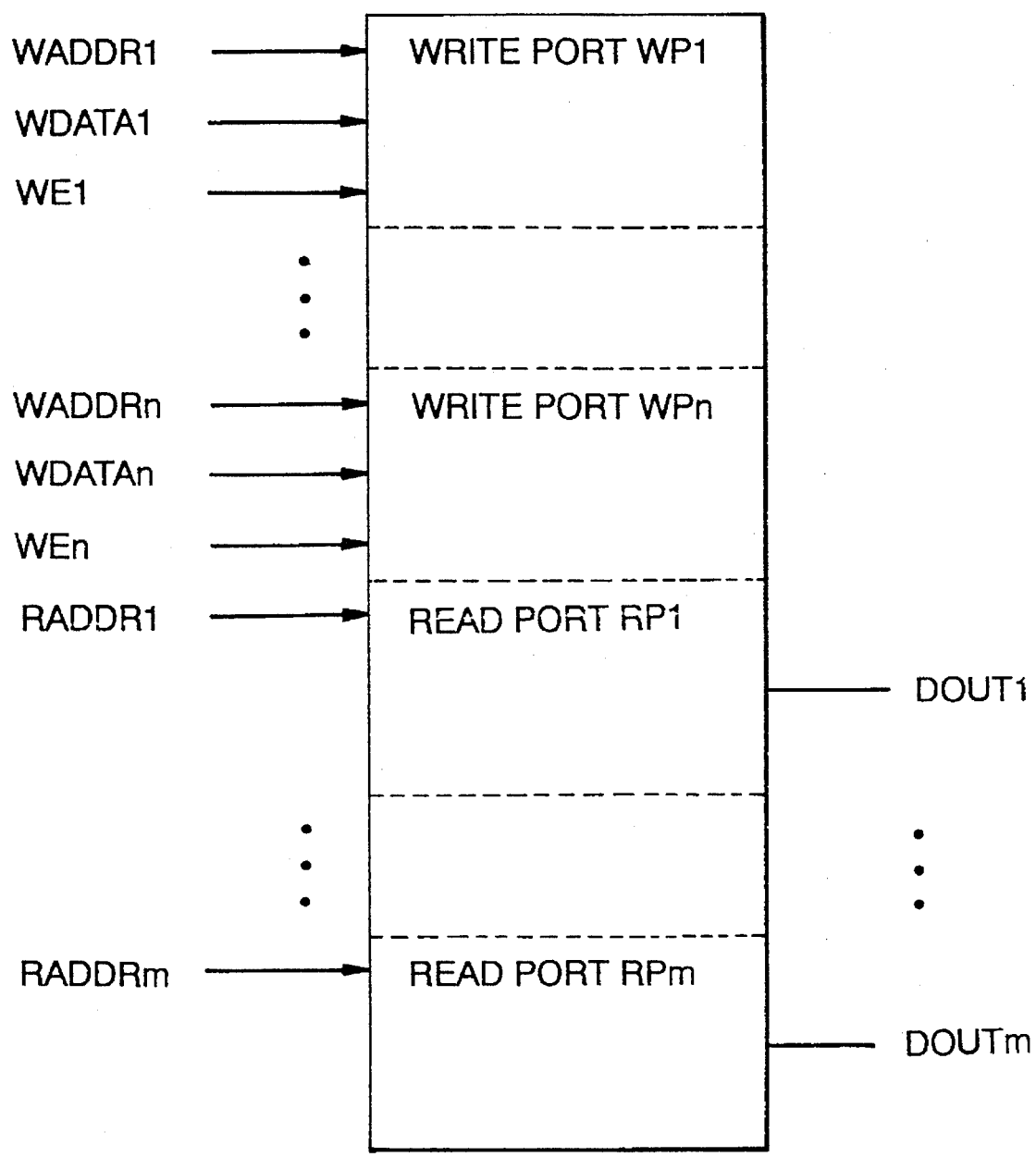
FIG. 1 is a diagram schematically showing an example of the construction of a general multi-port RAM.
Figure 3:
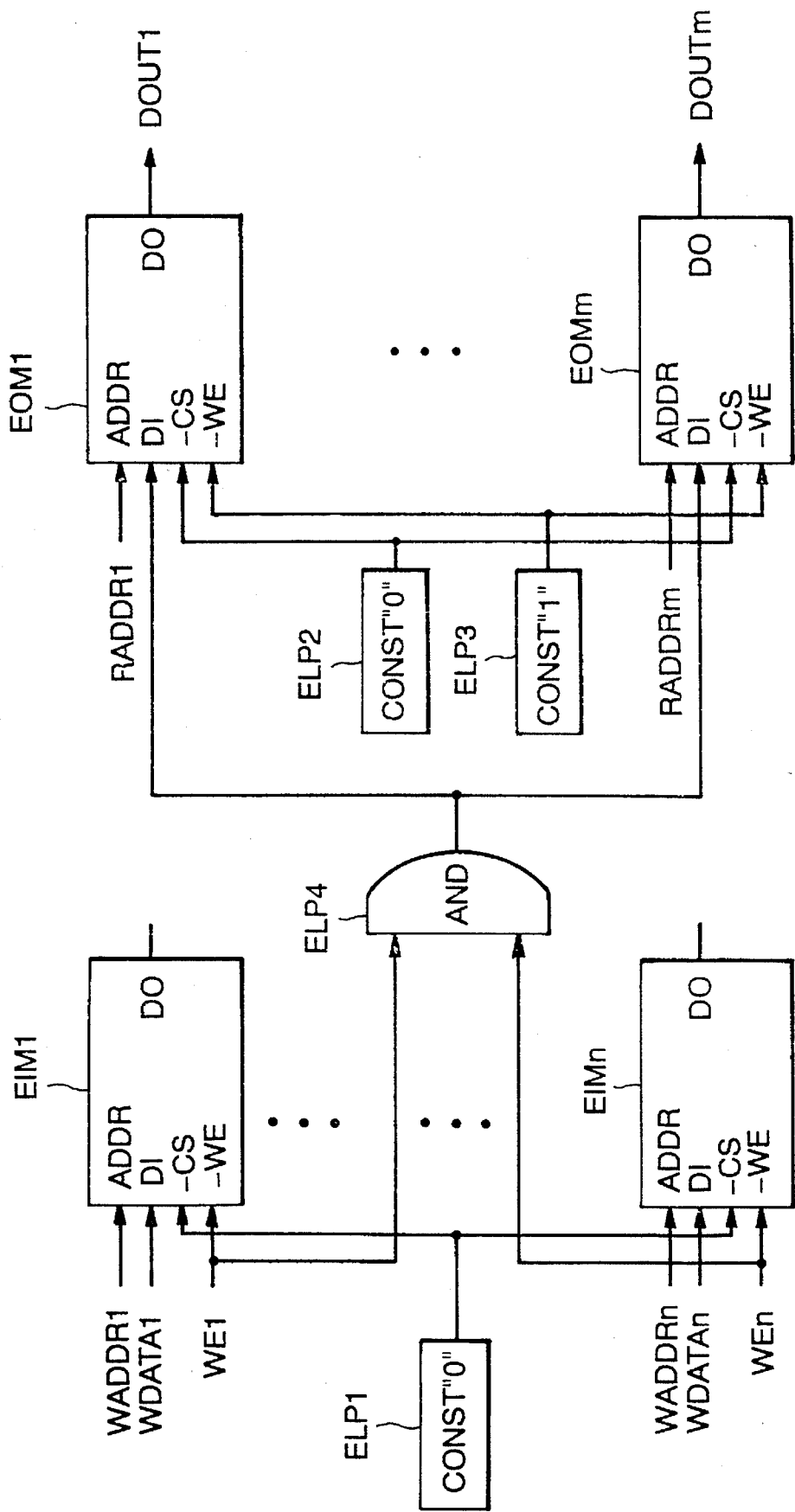
FIG. 3 is a block diagram showing a multi-port RAM which is constructed in a model form by use of memory primitives so as to effect simulation by the event-driven simulation in the system of FIG. 2.

FIG. 3 shows a model which symbolically represents the multi-port RAM shown in FIG. 1 in order to execute the event-driven simulation.

The multi-port RAM constructed in a model form includes n input side memory primitives EIM1 to EIMn, m output side memory primitives EOM1 to EOMm, and logic primitives ELP1 to ELP4.

Each of the input side memory primitives EIM1 to EIMn has an address terminal (ADDR), data input terminal (DI), chip selector terminal (–CS) and write enable terminal (–WE) and it does not use an output terminal.

Each of the output side memory primitives EOM1 to EOMm has an address terminal (ADDR), data input terminal (DI), chip selector terminal (–CS), write enable terminal (–WE) and data output terminal (DO).

As shown in FIG. 3, the logic primitives ELP1 and ELP2 always generate a logic "0" and the logic primitive ELP3 always generates a logic "1". The logic primitive ELP4 effects the logical AND operation.

The address terminal (ADDR), data input terminal (DI) and write enable terminal (–WE) of each of the input side memory primitives EIM1 to EIMn are respectively supplied with a corresponding one of write addresses WADDR1 to WADDRn, a corresponding one of write data items WDATA1 to WDATAn and a corresponding one of write enable signals WE1 to WEn. The chip select terminal (–CS) of each of the input side memory primitives EIM1 to EIMn is always supplied with a signal "0" output from the logic primitive ELP1.

The write enable signals WE1 to WEn are also supplied to the AND logic primitive ELP4.

The address terminals (ADDR) of the output side memory primitives EOM1 to EOMm are respectively supplied with readout addresses RADDR1 to RADDRm. The data input terminals (DI) of the output side memory primitives EOM1 to EOMm are commonly supplied with an output of the AND logic primitive ELP4 and the chip select terminals (–CS) of the output side memory primitives EOM1 to EOMm are always commonly supplied with a signal "0" output from the logic primitive ELP2. The write enable terminals (–WE) of the output side memory primitives EOM1 to EOMm are always commonly supplied with a signal "1" output from the logic primitive ELP3.

Data outputs DOUT1 to DOUTm are derived from the data output terminals (DO) of the output side memory primitives EOM1 to EOMm.

On the real memory, the addresses of the memory primitives EIM1 to EIMn and EOM1 to EOMm corresponding to a single multi-port RAM are treated as relative addresses on the common base address.

That is, in the case of normal RAMs (each of which is not a multi-port RAM) having a pair of write/read ports, the base addresses of the memory primitives are different for each to-be-evaluated RAM, but in a case where the logic simulation for the multi-port RAM is effected as shown in FIG. 3, the base addresses of a plurality of memory primitives EIM1 to EIMn and EOM1 to EOMm in the model provisionally constructing the individual multi-port RAM must be set to be equal to one another.

In general, in a case where the simulation is effected by use of such a memory model, storage data (storage data in simulation) of the memory primitives EIM1 to EIMn and EOM1 to EOMm is stored in the real memory, that is, in the memory of the simulator. In this system, the model constructing one to-be-evaluated logic circuit may have a plurality of memory models. In this case, since the real memory in which data is stored is present in the successive address spaces, it becomes necessary to determine the address range on the address space of the real memory to which the respective memory models are allotted. An address indicating the head of the real address of each memory model is the base address.

Since each memory model corresponding to a multi-port RAM must function as a single memory, the memory primitives constructing the memory model are set to have the common base address on the real memory. If the storage addresses of the respective memory models are overlapped on the memory space of the real memory, correct simulation cannot be effected. Therefore, in a case where simulation for the logic circuit including a plurality of multi-port RAMs is effected, an address obtained by shifting the base address of one of the memory models by an amount corresponding to the capacity of the multi-port RAM (or larger than the capacity thereof) is determined as the base address of the next memory model and thus the base addresses of the memory models corresponding to the respective multi-port RAMs are determined.

Figure 4:
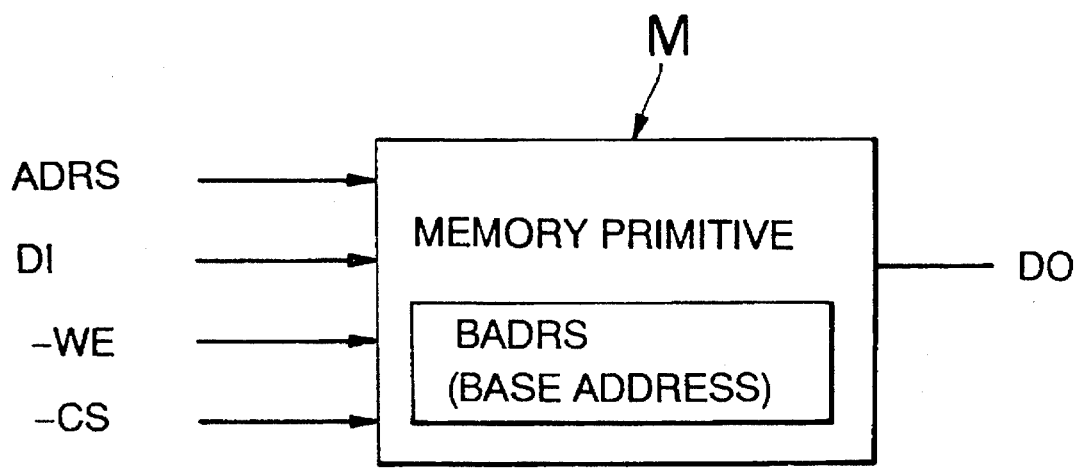
FIG. 4 is a model diagram showing the memory primitives used in the simulation shown in FIG. 3.

As shown in FIG. 4, each of the memory primitives M (that is, EIM1 to EIMn and EOM1 to EOMm) basically has the address terminal (ADDR), data input terminal (DI), chip select terminal (–CS), write enable terminal (–WE) and data output terminal (DO) and has a base address BADRS for the real memory. The base addresses BADRS of the memory primitives M are common for each memory model. That is, all of the memory primitives M constructing the same multi-port RAM have the same base address. Further, the base addresses BADRS of the memory primitives M are shifted by an amount corresponding to the capacity of the memory model in order to set different base addresses for different memory models so that the addresses on the real memory will not be overlapped.

Figure 5:
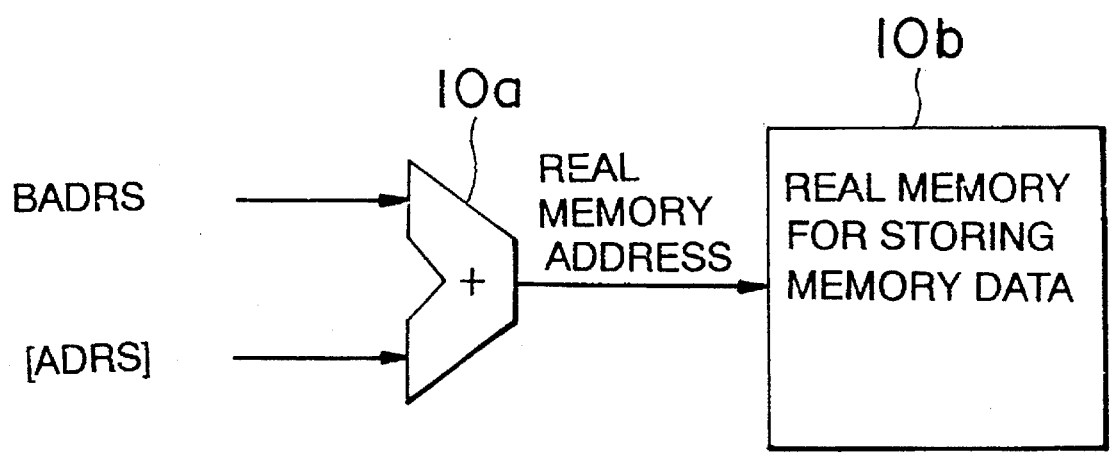
FIG. 5 is a block diagram showing an address creation circuit used in the system of FIG. 2.

Therefore, as shown in FIG. 5, the simulator 10 includes an address creating section 10a constructed by an adder and derives an address for a real memory 10b by adding together the input address [ADRS] of the address terminal (ADRS) of the memory primitive M and the base address BADRS set for the memory primitive M.

Next, simulation by the event-driven simulation using the memory model of the multi-port RAM shown in FIG. 3 is explained.

When the logic simulation by the event-driven simulation is effected, a variation in the logic circuit is evaluated each time an event such as the write operation occurs. In this case, occurrence of the event in the input side memory primitives EIM1 to EIMn shown in FIG. 3 must be transmitted to the output side memory primitives EOM1 to EOMm.

In FIG. 3, the chip select terminals (–CS) of the input side memory primitives EIM1 to EIMn are always supplied with "0" from the logic primitive ELP1 so that the input side memory primitives EIM1 to EIMn can be kept in a state in which all of the chips are selected.

Further, the logic primitive ELP4 disposed between the input side memory primitives EIM1 to EIMn and the output side memory primitives EOM1 to EOMm derives a logical AND of the write enable signals WE1 to WEn supplied to the write enable terminals (–WE) of the input side memory primitives EIM1 to EIMn and supplies the logical AND output to the data input terminals (DI) of the output side memory primitives EOM1 to EOMm.

Since signals on the write enable terminals (–WE) of the input side memory primitives EIM1 to EIMn are set in the form of negative logic, the signals are set at "1" in the normal mode (in the non-write mode). Therefore, when none of the input side memory primitives EIM1 to EIMn effect the write operation, the AND logic condition of the logic primitive ELP4 is satisfied and "1" is output from the logic primitive ELP4.

In the output side memory primitives EOM1 to EOMm, the chip select terminals (–CS) are always supplied with "0" from the logic primitive ELP2 and the output side memory primitives EOM1 to EOMm are kept in a state in which the chips are selected. Further, all of the write enable terminals (–WE) of the output side memory primitives EOM1 to EOMm are supplied with "1" from the logic primitive ELP3 and the output side memory primitives EOM1 to EOMm are exclusively used for readout. Therefore, in the output side memory primitives EOM1 to EOMm, outputs DOUT1 to DOUTm from the respective output terminals (DO) are kept unchanged even if inputs to the data input terminals (DI) are changed in any manner.

The base addresses on the real memory for the memory primitives EIM1 to EIMn and the memory primitives EOM1 to EOMm on the memory model constructing the multi-port RAM coincide with each other and the addresses of the input side memory primitives EIM1 to EIMn and the output side memory primitives EOM1 to EOMm for the same memory will be prevented from becoming different from each other.

In this case, assume that data items are simultaneously written into different addresses for the input side first memory primitive EIM1 constructing the first input port and the input side n-th memory primitive EIMn constructing the n-th input port, for example.

In the simulator 10, the input side first memory primitive EIM1 and the input side n-th memory primitive EIMn are sequentially evaluated (the order thereof is not definite). As a result, the value of write data WDATA1 and the value of write data WDATAn are written into the respective addresses.

At the time of above write operation, since the write enable signals WE1 and WEn of the input side memory primitives EIM1 and EIMn are changed from "1" to "0", the AND logic condition of the AND logic primitive ELP4 is not satisfied and inputs to the data input terminals (DI) of the output side memory primitives EOM1 to EOMm are changed from "1" to "0".

Then, in the simulator 10, occurrence of an event is detected according to a variation in the data input (DI) to the output side memory primitives EOM1 to EOMm, data outputs DOUT1 to DOUTm of the output side memory primitives EOM1 to EOMm obtained at this time are evaluated and the newest memory contents can be obtained. Thus, for example, even when the write address and read address for the memory model coincide with each other, data which has been written in a directly preceding cycle can be adequately read out.

That is, when at least one of the write enable signals WE1 to WEn of the input side memory primitives EIM1 to EIMn becomes active, the logic primitives ELP1 to ELP4 transmit the variation and drives the data input terminals (DI) of the output side memory primitives EOM1 to EOMm to set all of the output side memory primitives EOM1 to EOMm into the active state.

Next, a case wherein a concrete multi-port RAM is used as an example and evaluated is explained.

Figures 6, 7:
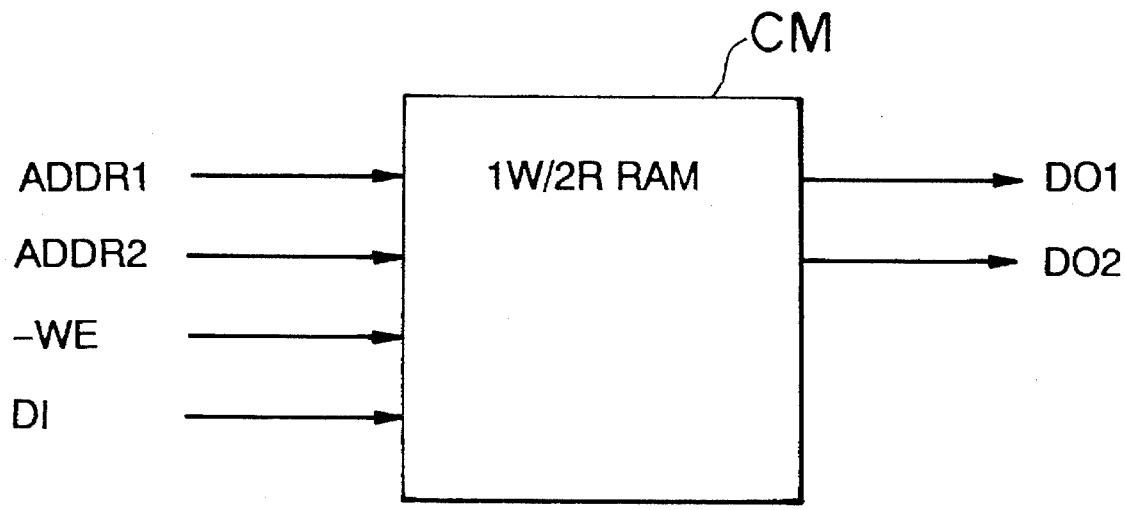
FIG. 6 is a diagram showing the concrete construction of an example of a multi-port RAM.
FIG. 7 shows a truth table diagram showing an example of the operation of the multi-port RAM shown in FIG. 6.

As a to-be-evaluated object, a circuit model which is constructed by a 1W/2R type multi-port RAM having one write port and two read ports and operated according to input/output signals shown in FIG. 6 based on the truth table shown in FIG. 7 is used as an example.

The circuit model CM shown in FIG. 6 has address input terminals (ADDR1, ADDR2), write enable terminal (–WE) and data input terminal (DI) as input terminals and data output terminals (DO1, DO2) as output terminals.

In the circuit model, an address input to the address input terminal (ADDR1) is used as a data write address and as an address for reading out data from the data output terminal (DO1).

As shown in the truth table of FIG. 7, when an input to the address input terminal (ADDR1) and an input to the address input terminal (ADDR2) are not equal to each other and an input to the write enable terminal (–WE) is set at the "H" level, a read mode is set, and at this time, the storage contents in respective locations designated by the input addresses of the address input terminals (ADDR1) and (ADDR2) are respectively output from the data output terminals (DO1) and (DO2). When an input to the address input terminal (ADDR1) and an input to the address input terminal (ADDR2) are not equal to each other and an input to the write enable terminal (–WE) is set at the "L" level, a write mode is set, and at this time, the data written in a location designated by the input address of the address input terminal (ADDR1) is output from the data output terminal (DO1) and the storage content in a location designated by the input address of the address input terminal (ADDR2) is output from the data output terminal (DO2).

In the circuit model CM, when input addresses to the address input terminals (ADDR1) and (ADDR2) are equal to each other, that is, when the same address is accessed at the same time, the result is not ensured. Then, input addresses which are equal to each other are input to the address input terminals (ADDR1) and (ADDR2), the simulator 10 outputs "X" (indicating an indefinite state in which the output cannot be determined to "1" or "0") from the data output terminals (DO1) and (DO2) and thus provides a warning.

Figure 8:
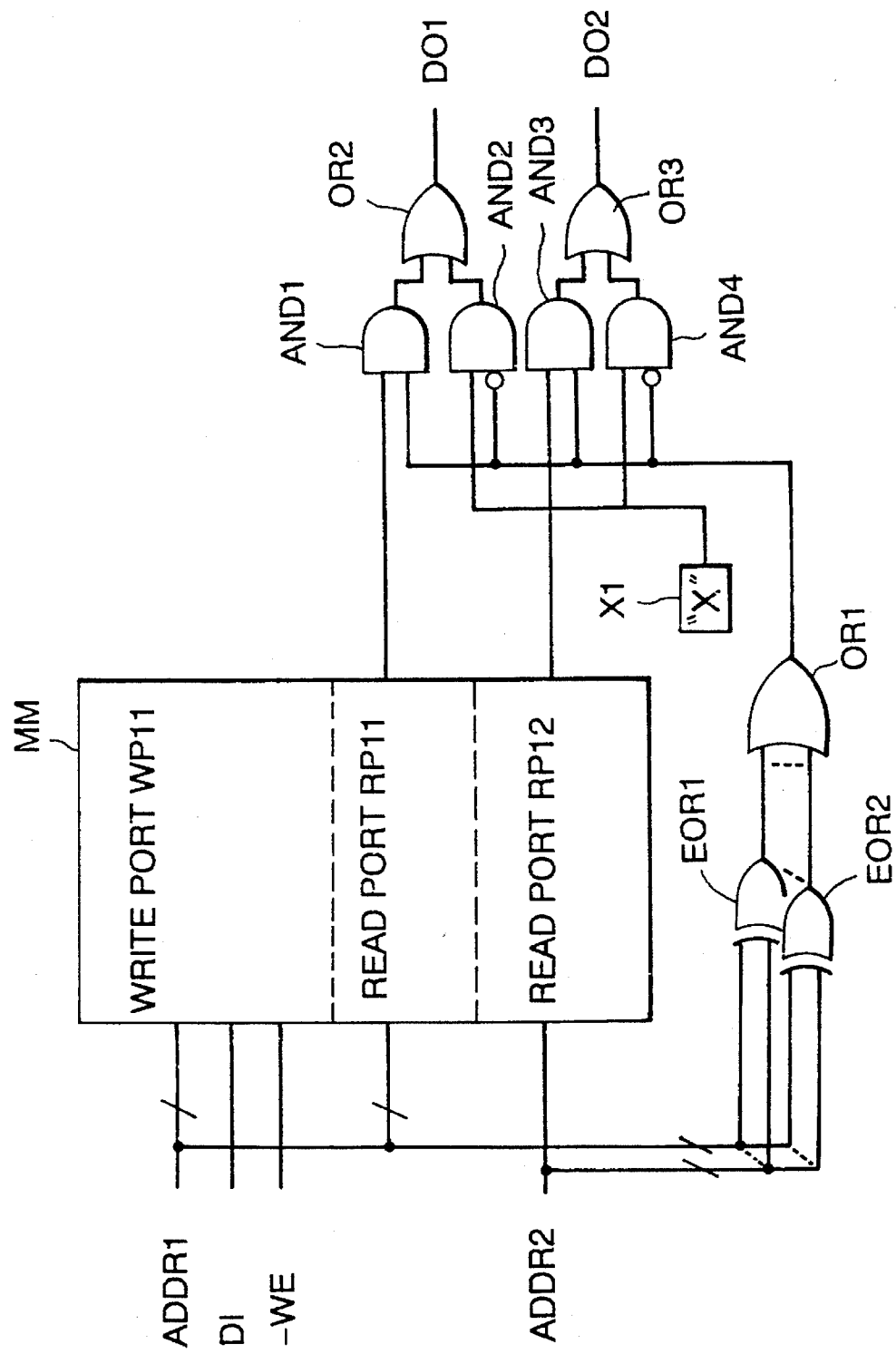
FIG. 8 is a block diagram showing an example of a simulation model of a circuit including the multi-port RAM shown in FIGS. 6 and 7.

FIG. 8 shows an example obtained by representing the circuit model shown in FIG. 6 in a concrete model form, and a memory section MM which is a main portion of the multi-port RAM can be realized by combining memory primitives M like the memory primitive shown in FIG. 4 in the same manner as shown in FIG. 3.

In the circuit model of FIG. 8, an input address to the first address input terminal (ADDR1) is input to a first write port WP11 and first read port RP11 and to first and second exclusive OR gates EOR1 and EOR2 which are logic primitives. An input address to the second address input terminal (ADDR2) is input to a second read port RP12 and to the first and second exclusive OR gates EOR1 and EOR2. Outputs of the exclusive OR gates EOR1 and EOR2 which derive the exclusive OR values of the inputs to the address input terminals ADDR1 and ADDR2 are input to AND gates AND1 to AND4 which are logic primitives via an OR gate OR1 which is a logic primitive. The AND gate AND1 is supplied with an output of the first read port RP11 and an output of the OR gate OR1 and the AND gate AND3 is supplied with an output of the second read port RP12 and an output of the OR gate OR1. The AND gate AND2 is supplied with an output of a logic primitive X1 which always outputs "X" and a signal which is a negative logic (an inverted form) of an output of the OR gate OR1 and the AND gate AND4 is supplied with an output of the logic primitive X1 and a signal which is a negative logic of an output of the OR gate OR1. Outputs of the AND gates AND1 and AND2 are supplied to the output terminal DO1 via a OR gate OR2 which is a logic primitive and outputs of AND gates AND3 and AND4 are supplied to the output terminal DO2 via an OR gate OR3 which is a logic primitive.

At the time of simulation, the circuit model is operated according to the truth table shown in FIG. 7.

When input addresses to the address input terminals (ADDR1) and (ADDR2) are different from each other and an input to the write enable terminal (−WE) is set to the "L" level, the logical conditions of exclusive OR of the exclusive OR gates EOR1 and EOR2 are satisfied and "1" is input to the AND gates AND1 and AND3 to enable (i.e, to open) the AND gates. At this time, "1" is input to the negative logic input terminals of the AND gates AND2 and AND4 and therefore the AND gates AND2 and AND4 are disabled (i.e., closed). In this condition, the storage content in a location designated by the address input to the address input terminal (ADDR1) is output from the first read port RP11 and supplied to the data output terminal (DO1) via the AND gate AND1 and OR gate OR2. At the same time, the storage content in a location designated by the address input to the address input terminal (ADDR2) is output from the second read port RP12 and supplied to the data output terminal (DO2) via the AND gate AND3 and OR gate OR3.

When input addresses to the address input terminals (ADDR1) and (ADDR2) are different from each other and an input to the write enable terminal (−WE) is set to the "H" level, write data input to the write port WP11 is output from the first read port RP11 and supplied as it is to the data output terminal (DO1) via the AND gates AND1 and AND2.

On the other hand, when input addresses to the address input terminals (ADDR1) and (ADDR2) are equal to each other, the logical conditions of exclusive OR of the exclusive OR gates EOR1 and EOR2 are not satisfied so that "0" will be output from the OR gate OR1 and the AND gates AND1 and AND3 will be disabled. At this time, the AND gates AND2 and AND4 which receive the inverted form (negative logic) of an output of the OR gate OR1 are enabled and "X" output from the logic primitive X1 is supplied to the data output terminal (DO1) via the AND gate AND2 and OR gate OR2 and to the data output terminal (DO2) via the AND gate AND4 and OR gate OR3.

As described above, the logic simulation of the circuit including the multi-port RAM shown in FIG. 8 can be effected by provisionally realizing the multi-port RAM by use of a combination of the memory primitives as shown in FIG. 3.

Figure 9:
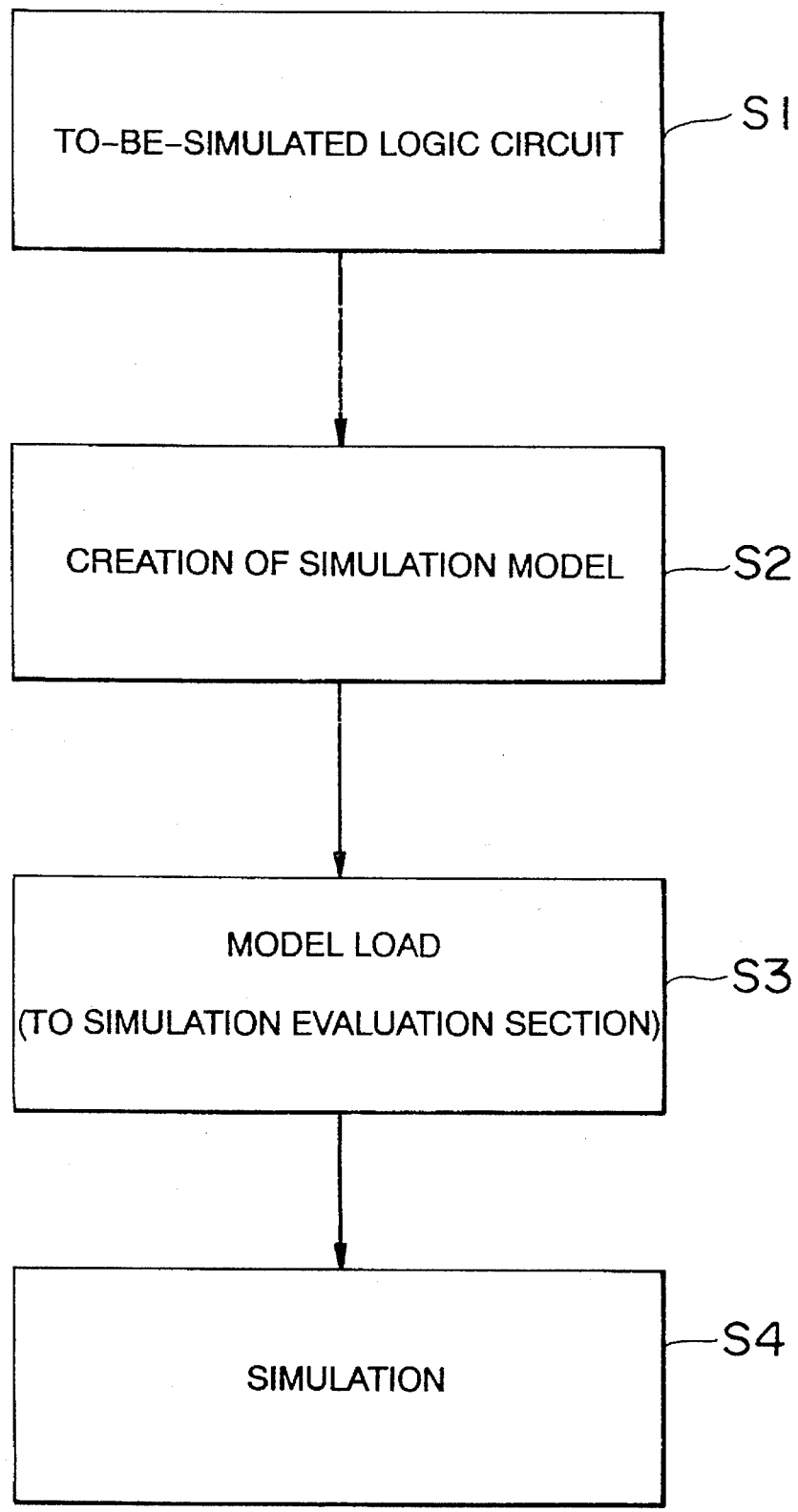
FIG. 9 is a flowchart showing the procedure of the simulation in the system of FIG. 2.

FIG. 9 is a flowchart for illustrating the logic simulation procedure for the logic circuit by the event-driven simulation. In the event-driven simulation, basically, the status variation is detected and evaluated for each clock and the evaluation is repeatedly effected until an output by the status variation becomes stable.

When a to-be-simulated logic circuit is provided for the simulator 10 (step S1), the logic circuit is broken down by a breakdown section 100 and simulation models are created by a model creating section 102 (step S2), the simulation models are loaded into a simulation evaluating section 104 of the simulator 10 (step S3) and then simulation is effected (step S4). The simulation model creating process in the step S2 includes a step of converting the multi-port memory section of the logic circuit into models constructed by memory primitives as described above. In the simulation model creating process in the step S2, models are created by use of constituents which are constructed in a library form for each element, for example.

Figure 10:
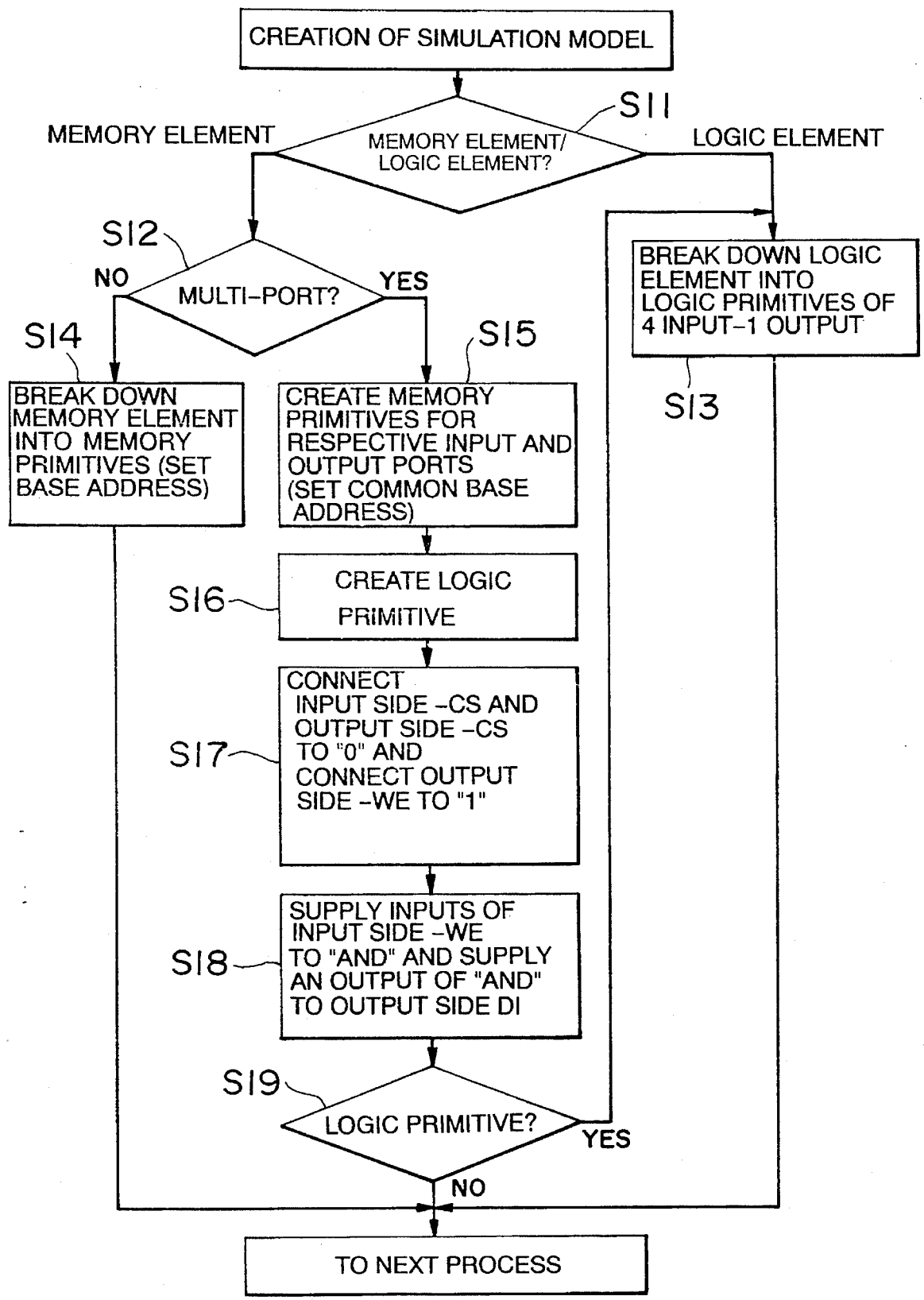
FIG. 10 is a flowchart showing the procedure of model creation in the case of the event-driven simulation.

That is, the simulation model creating process in the step S2 effects the process shown in FIG. 10.

When the simulation model creating process is started, the object logic circuit is broken down into memory elements and logic elements (step S11). It is determined whether the memory elements are multi-port memories or not based on the number of ports (step S12) and the logic elements are broken down into predetermined logic primitives, for example, 4-input/1-output logic primitives (step S13). A memory element which is determined not to be a multi-port memory is set to have a predetermined base address and broken down into a single memory primitive (step S14).

A memory element which is determined to be a multi-port memory is broken down into memory primitives of a number corresponding to the number of input and output ports for each multi-port memory, the memory primitives are set to have a common base address (step S15) and a "0" logic primitive for always outputting a constant "0", a "1" logic primitive for always outputting a constant "1", and an AND logic primitive having input terminals of a number corresponding to the number of the input ports, for deriving the logical AND are created (step S16).

The output of the "0" logic primitive is connected to the chip select terminal (−CS) of the input side memory primitive and the chip select terminal (−CS) of the output side memory primitive and the output of the "1" logic primitive is connected to the write enable terminal (−WE) of the output side memory primitive (step S17). An input to the write enable terminal (−WE) of each of the input side memory primitives is input to the AND logic primitive and the output of the AND logic primitive is connected to the data input terminals (DI) of the output side memory primitives (step S18).

The primitives created by constructing the multi-port memory in a model form are divided into memory primitives and logic primitives (step S19) and the logic primitives are subjected to the step S13 and processed in the same manner as a normal logic primitive. If the whole contents of the object logic circuit are determined to be memory primitives in the step S19, or when the processes in the steps S13 and S14 are completed, the simulation model creating process is completed and the next model load processing step S3 is effected.

[Embodiment 2]

Figure 11:
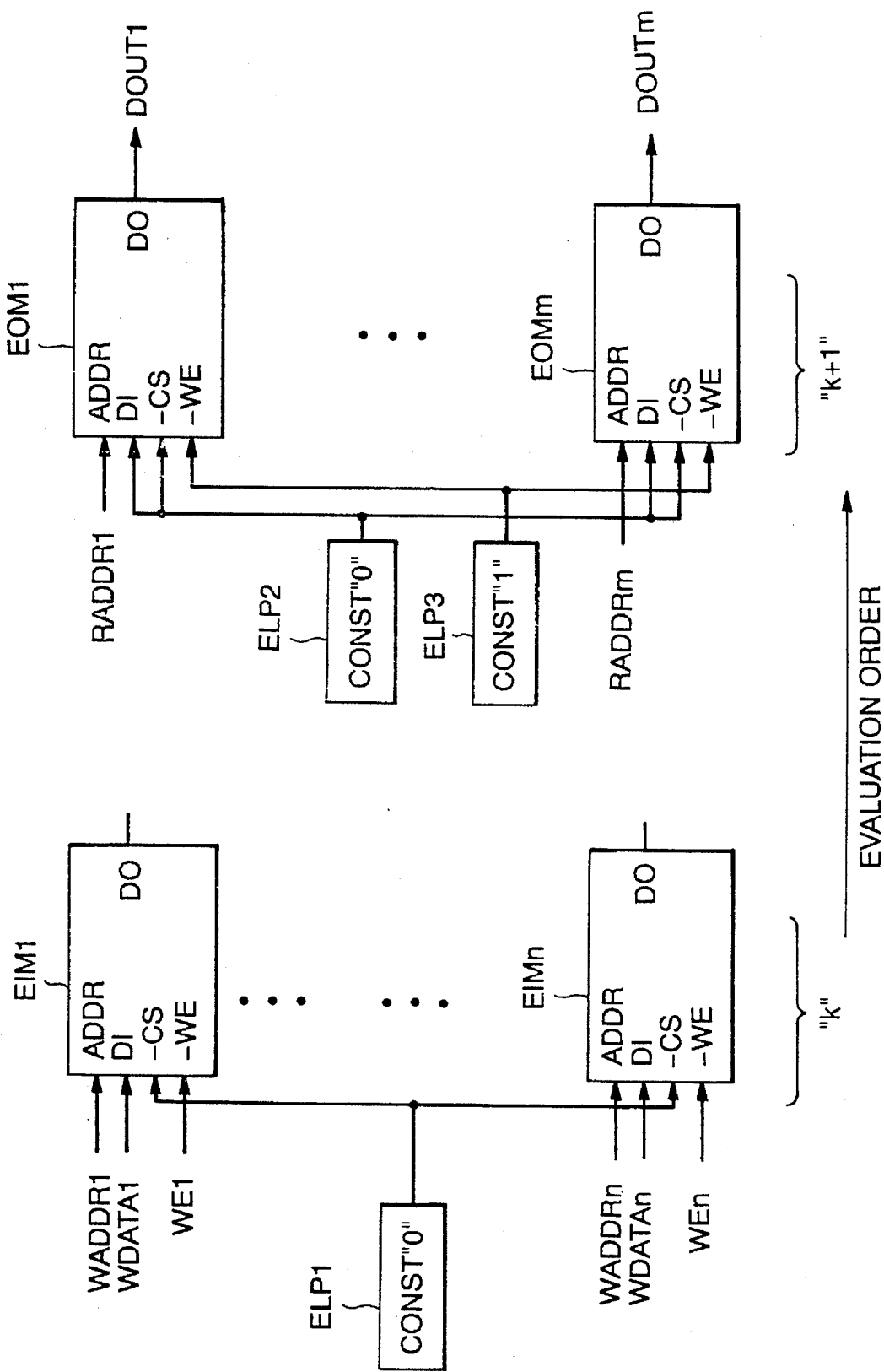
FIG. 11 is a block diagram of a multi-port RAM which is constructed in a model form by use of memory primitives so as to effect the rank order simulation.

In the above description, the simulation model of the multi-port memory based on the event-driven simulation is explained, and FIG. 11 shows an example of the construction of a memory model in a case where the rank order simulation is used as the simulation logic.

The simulation model shown in FIG. 11 is similar to the simulation model shown in FIG. 3 except that the AND logic primitive ELP4 shown in FIG. 3 is omitted, the data input terminal (DI) and chip select terminal (–CS) of each of the output side memory primitives EOM1 to EOMm are connected together and inputs to both of them are fixed to "0" by a "0" logic primitive ELP2.

The rank order simulation is an evaluation algorithm for sequentially effecting the simulation in an order from a circuit whose level is high (which has a smaller level value) to a circuit whose level is low (which has a larger level value). In this case, the input side memory primitives EIM1 to EIMn are defined to be set at a level (for example, at a level "k") higher than that of the output side memory primitives EOM1 to EOMm and the output side memory primitives EOM1 to EOMm are defined to be set at a lower level (for example, at a level "k+1").

By defining the input side memory primitives EIM1 to EIMm and the output side memory primitives EOM1 to EOMm as described above, it is ensured that the readout operation with respect to the output side memory primitives EOM1 to EOMm is effected after the write operation with respect to the input side memory primitives EIM1 to EIMm and thus erroneous evaluation for the simulation caused by effecting the readout operation before effecting the write operation can be prevented.

Figure 12:
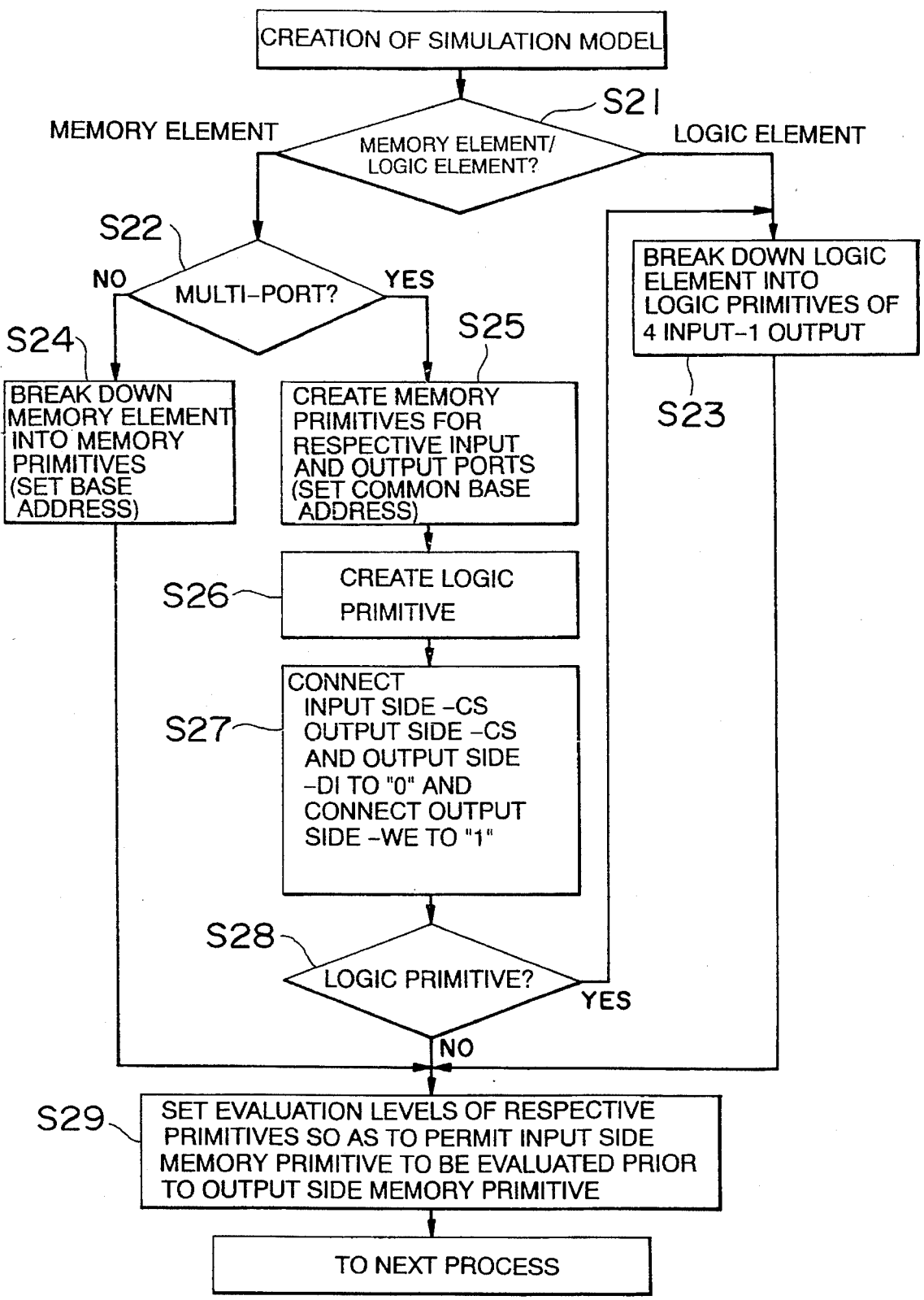
FIG. 12 is a flowchart showing the procedure of model creation in the case of the rank order simulation.

FIG. 12 is a flowchart showing the procedure of the model creation process in the logic simulation for the logic circuit by the above-described rank order simulation.

In the case of rank order simulation, when the simulation model creation process is started, an object logic circuit is broken down into memory elements and logic elements (step S21). It is determined in the step S22 whether the memory element is a multi-port memory or not according to the number of ports and the logic elements are broken down into preset primitives, for example, 4-input/1-output logic primitives (step S23). A memory element which is determined not to be a multi-port memory is set to have a preset base address and then broken down into a single memory primitive (step S24).

A memory element which is determined to be a multi-port memory is broken down into memory primitives of a number corresponding to the number of input and output ports for each multi-port memory, the memory primitives are set to have a common base address (step S25) and a "0" logic primitive for always outputting a constant "0" and a "1" logic primitive for always outputting a constant "1" are created (step S26).

The output of the "0" logic primitive is connected to the chip select terminal (–CS) of the input side memory primitive, the chip select terminal (–CS) of the output side memory primitive and the data input terminal (DI) of the output side memory primitive, and the output of the "1" logic primitive is connected to the write enable terminal (–WE) of the output side memory primitive (step S27).

The primitives created for constructing the multi-port memory in a model form are divided into memory primitives and logic primitives (step S28) and the logic primitives are subjected to the step S23 and processed in the same manner as a normal logic primitive. If the whole contents of the object logic circuit are determined to be memory primitives in the step S28, or the processes in the steps S23 and S24 are completed, the evaluation levels of the respective primitives are so set that the input side memory primitives can be evaluated prior to the output side memory primitives (step S29), the simulation model creating process is completed and the next model load processing step (corresponding to the step S3 in FIG. 9) S3 is effected.

As described above, according to this invention, effective simulation for the logic circuit including a multi-port memory can be effected by adequately constructing the multi-port memory in a simulation model form by use of memory primitives.

The system of this invention can be applied to software simulation effected by use of a computer, hardware simulation effected by use of hardware logic or simulation effected by use of a combination of the software and hardware.

Particularly, in the system utilizing the algorithm by the event-driven simulation, the simulation model creating section can be comparatively easily attained, although the structure of the simulation executing section is complicated. For example, the logic system can be converted into a model form as it is even when a feedback system is contained in the logic system. In the event-driven simulation, only a changed element is to be evaluated, therefore a high speed operation of the simulation execution section can be attained.

On the other hand, in the system utilizing the algorithm by the rank order simulation, it takes a long time to effect the process, because of evaluating all the elements on every clock cycle, but the simulation algorithm itself is simple and the hardware therefor can be easily attained. In creating a simulation model, when a feedback system is contained in the logic system the logic system must be converted to the logical equivalent circuit model which effects as the logic system without a feedback system.

What is claimed is:

1. A logic simulation method for evaluating a logic system including a multi-port memory having a plurality of independently addressable ports, each of which is one of input and output ports, by use of logic simulation, comprising the steps of:

constructing each of the input and output ports of said multi-port memory in a simulation model form using a corresponding plurality of memory primitives, said constructing step including the steps of:
(1) setting said plurality of memory primitives representing the input and output ports of said multi-port memory to have a common base address, and
(2) creating logic primitives for effecting preset logic processes in connection with said respective memory primitives having said common base address by creating one of the logic primitives for transmitting an occurrence of a write operation of a memory primitive representing an input port to a memory primitive representing an output port; and evaluating the logic system using the constructed simulation model according to an event-driven simulation only when a status variation occurs in said logic system.

2. A method according to claim 1, wherein said constructing step includes a step of creating an input side memory primitive for constructing an input port in a model form and an output side memory primitive for constructing an output port in a model form and a step of creating a logic primitive for indicating an event occurrence by changing a data input to said output side memory primitive in response to a variation in write enable information of the input side memory primitive and said evaluating step includes a step of effecting simulation by the event-driven simulation only when a status variation occurs.

3. A method according to claim 2, wherein said creating step includes a step of creating a logic primitive for supplying an active output to a data input terminal of said output side memory primitive when at least one of the write enable information items of all of the input side memory primitives becomes active.

4. A logic simulation apparatus for evaluating a logic system including a multi-port memory having a plurality of independently addressable ports, each of which is one of input and output ports, by use of logic simulation, comprising:

model creation means for constructing each of the input and output ports of said multi-port memory in a simulation model form using a corresponding plurality of memory primitives, said model creation means including:
(1) base address setting means for setting said plurality of memory primitives representing the input and output ports of said multi-port memory to have a common base address, and
(2) logic primitive creation means for creating logic primitives for effecting preset logic processes in connection with said respective memory primitives having said common base address, said logic primitive creation means including means for creating one of the logic primitives for transmitting an occurrence of a write operation of a memory primitive representing an input port to a memory primitive representing an output port; and simulation means for evaluating the logic system using the constructed simulation model according to an event-driven simulation only when a status variation occurs in said logic system.

5. An apparatus according to claim 4, wherein said model creation means includes memory primitive creation means for creating an input side memory primitive for constructing an input port in a model form and an output side memory primitive for constructing an output port in a model form, and logic primitive creation means for creating a logic primitive for indicating an event occurrence by changing a data input to said output side memory primitive in response to a variation in write enable information of the input side memory primitive, and said simulation means includes evaluation means for affecting simulation by the event-driven simulation only when a status variation occurs.

6. An apparatus according to claim 5, wherein said logic primitive creation means includes means for creating a logic primitive for supplying an active output to a data input terminal of the output side memory primitive when at least one of the write enable information items of all of the input side memory primitives becomes active.

7. A logic simulation method for evaluating a logic system including a multi-port memory having a plurality of independently addressable ports, each of which is one of input and output ports, by use of logic simulation, comprising the steps of:

constructing each of the input and output ports of said multi-port memory in a simulation model form using a corresponding plurality of memory primitives, said constructing step including the steps of:
(1) setting said plurality of memory primitives representing the input and output ports of said multi-port memory to have a common base address, and
(2) creating logic primitives for effecting preset logic processes in connection with said respective memory primitives having said common base address by creating one of the logic primitives for transmitting an occurrence of a write operation of a memory primitive representing an input port to a memory primitive representing an output port; and evaluating the logic system using the constructed simulation model.

8. A logic simulation apparatus for evaluating a logic system including a multi-port memory having a plurality of independently addressable ports, each of which is one of input and output ports, by use of logic simulation, comprising:

model creation means for constructing each of the input and output ports of said multi-port memory in a simulation model form using a corresponding plurality of memory primitives, said model creation means including:
(1) base address setting means for setting said plurality of memory primitives representing the input and output ports of said multi-port memory to have a common base address; and
(2) logic primitive creation means for creating logic primitives for effecting preset logic processes in connection with said respective memory primitives having said common base address, said logic primitive creation means including means for creating one of the logic primitives for transmitting an occurrence of a write operation of a memory primitive representing an input port to a memory primitive representing an output port; and simulation means for evaluating the logic system using the constructed simulation model.

* * * * *